United States Patent
Oh et al.

(10) Patent No.: US 9,608,850 B2
(45) Date of Patent: Mar. 28, 2017

(54) SPINTRONIC WIRELESS COMMUNICATION SYSTEM FOR SIMULTANEOUSLY MODULATING MULTI-BAND FREQUENCY AND AMPLITUDE

(71) Applicants: KOREA ADVANCED INSTITUTE OF SCIENCE AND TECHNOLOGY, Daejeon (KR); KOREA BASIC SCIENCE INSTITUTE, Daejeon (KR); KOREA INSTITUTE OF SCIENCE AND TECHNOLOGY, Seoul (KR)

(72) Inventors: InnYeal Oh, Daejeon (KR); ChulSoon Park, Daejeon (KR); MinChul Shin, Daejeon (KR); SeungYoung Park, Daejeon (KR); ByoungChul Min, Seoul (KR); SukHee Han, Seoul (KR)

(73) Assignees: KOREA ADVANCED INSTITUTE OF SCIENCE AND TECHNOLOGY, Daejeon (KR); KOREA BASIC SCIENCE INSTITUTE, Daejeon (KR); KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 14/911,275

(22) PCT Filed: Nov. 1, 2013

(86) PCT No.: PCT/KR2013/009849
§ 371 (c)(1),
(2) Date: Mar. 23, 2016

(87) PCT Pub. No.: WO2015/023028
PCT Pub. Date: Feb. 19, 2015

(65) Prior Publication Data
US 2016/0191281 A1    Jun. 30, 2016

(30) Foreign Application Priority Data

Aug. 12, 2013    (KR) .................. 10-2013-0095587

(51) Int. Cl.
*H04L 27/04* (2006.01)
*H04L 5/06* (2006.01)
(Continued)

(52) U.S. Cl.
CPC ............ *H04L 27/04* (2013.01); *H01F 10/32* (2013.01); *H01L 43/00* (2013.01); *H03B 15/006* (2013.01);
(Continued)

(58) Field of Classification Search
USPC .......... 375/300, 307, 279; 332/100; 370/206
See application file for complete search history.

(56) References Cited

U.S. PATENT DOCUMENTS 8,131,249 B2    3/2012 Maehara
8,180,427 B2    5/2012 Phua et al.
(Continued)

FOREIGN PATENT DOCUMENTS

KR    10-2008-0104127 A    12/2008
KR    10-2011-0031408 A    3/2011
(Continued)

*Primary Examiner* — Eva Puente
(74) *Attorney, Agent, or Firm* — Rabin & Berdo, P.C.

(57) ABSTRACT

A spintronic wireless communication system for simultaneously modulating multiband frequencies and amplitudes includes a plurality of spin-torque transfer devices which have different frequency characteristics from each other, and OOK modulate or multi-level ASK modulate input data to thereby output a multiband OOK modulation signal or a multiband, multi-level ASK modulation signal; a plurality of matching networks which match individual impedances of the plurality of spin-torque transfer devices; and a broadband antenna which receives the multiband OOK modula- (Continued)

tion signal or the multiband, multi-level ASK modulation signal from ends of the plurality of matching networks and simultaneously transmits the signals to the outside.

15 Claims, 6 Drawing Sheets

(51) Int. Cl.
    *H01F 10/32*     (2006.01)
    *H01L 43/00*     (2006.01)
    *H03B 15/00*     (2006.01)
    *H04L 27/06*     (2006.01)
    *H04L 5/00*     (2006.01)
    *H04L 25/49*     (2006.01)

(52) U.S. Cl.
    CPC .............. *H04L 5/0005* (2013.01); *H04L 5/06* (2013.01); *H04L 25/4917* (2013.01); *H04L 27/06* (2013.01)

(56) References Cited

U.S. PATENT DOCUMENTS

| | | |
|---|---|---|
| 8,581,672 B2 | 11/2013 | Pasanen et al. |
| 8,610,512 B2 | 12/2013 | Michel et al. |
| 8,948,307 B2* | 2/2015 | Fujimoto ................ H04L 27/04 375/300 |
| 2002/0057254 A1* | 5/2002 | Kurashima ............. G06F 3/038 345/156 |
| 2004/0100897 A1* | 5/2004 | Shattil ....................... H04L 1/04 370/206 |
| 2009/0203988 A1 | 8/2009 | Phua et al. |
| 2010/0036211 A1* | 2/2010 | La Rue ................. A61B 5/0002 600/301 |
| 2010/0202785 A1* | 8/2010 | Kawanishi ........... H04B 10/505 398/185 |
| 2011/0051481 A1 | 3/2011 | Maehara |
| 2011/0280340 A1 | 11/2011 | Pasanen et al. |
| 2012/0268214 A1 | 10/2012 | Michel et al. |
| 2015/0318823 A1* | 11/2015 | Park ......................... H03D 1/00 332/100 |
| 2016/0224135 A1* | 8/2016 | Kremin ................. G06F 3/0383 |

FOREIGN PATENT DOCUMENTS

| | | |
|---|---|---|
| KR | 10-2011-0036205 A | 4/2011 |
| KR | 10-2011-0115996 A | 10/2011 |

* cited by examiner

SPINTRONIC WIRELESS COMMUNICATION SYSTEM FOR SIMULTANEOUSLY MODULATING MULTI-BAND FREQUENCY AND AMPLITUDE

STATEMENT REGARDING SPONSORED RESEARCH

The present invention was supported by a grant 2015-008571 from the Ministry of Science, ICT and Future Planning of Korea.

CROSS-REFERENCE TO RELATED APPLICATIONS

The present application claims priority under 35 U.S.C. 119 to Korean Patent Application No. 10-2013-0095587, filed on Aug. 12, 2013, the disclosure of which is expressly incorporated by reference herein in its entirety.

TECHNICAL FIELD

The present invention relates to a multi-band spintronic communication technique, and more specifically, to a spintronic wireless communication system which generates a multi-band OOK modulation signal or a multi-band multi-level ASK modulation signal for each one period of a sub-clock using spin-torque transfer devices with a short oscillation-settling time and frequency bands different from each other, to maximize transmission efficiency and to transmit mass data.

BACKGROUND ART

As short-range wireless transmission technologies, there are a Bluetooth technology, a ZigBee technology, and a radio frequency identification (RFID) technology. Such technologies represent performance in which a data transmission rate is the maximum of 3 Mbps level. In addition, there is an ultra-wideband (UWB) technology that is wideband frequency communication of transferring a signal with a transient pulse, but a transmission rate is the maximum 480 Mbps. In the high-speed wideband communication method, international standards are not achieved due to disagreement among enterprises, and technology development is further necessary to transmit gigabits per second or transmit high-definition video and mass data in transmission characteristics. Of course, as a technology capable of transmitting gigabits, there is a 60 GHz technology and a THz technology, but it is difficult to embody them with the current technology level, and the technology is limited to line-of-sight communication due to straight characteristics of signals in the corresponding frequency band, and there is a disadvantage of high power consumption. In a local area network using a frequency of 5 GHz band, a wireless technology of IEEE802.11ac is introduced as a wireless computer networking standard, but a plurality of high power amplifiers are used to embody multiple inputs multiple outputs (MIMO), and thus there is a problem that power consumption highly occurs.

In such conventional technologies, frequencies are set by a plurality of oscillators, data is modulated and transmitted, power consumption becomes high, a size thereof becomes large, and thus it is difficult to make multi-frequency. In addition, the conventional oscillator has narrowband frequency characteristics, it is difficult to adjust each frequency to be wide, and it is not easy to embody multi-frequency.

Due to such reasons, in the existing technology, a method has been used in which a multi-carrier is made in a signal processing course and is transmitted as one carrier wave at the time of RF transmission. Since the multi-carrier signal is used in the signal processing course of mass data, a wideband high-speed process is required. Accordingly, there is a problem that a wireless transmission and reception system is complicated and power consumption is high. An innovative technology of embodying high-speed wireless transmission characteristics with a small size and low power consumption is urgently required.

Korea published Patent No. 2011-0115996 (Oct. 24, 2011) discloses an invention about a multi-band data transmission technology, it is possible to simply design analog filters which separate frequency bands different from each other, and a digital signal process of synchronizing the bands is simply embodied, but there is a problem that an oscillation-settling time of an RF modulator is long, a data transmission rate is low, and a volume of a data transmission system is large.

SUMMARY OF INVENTION

Technical Problem

The object of the present invention, which has been developed according to the aforementioned necessity, is to provide a multi-band spintronic wireless communication system and a manufacturing method thereof capable of remarkably increasing a transmission speed and decreasing a volume thereof by using spin-torque transfer devices with a short oscillation-settling time and frequency bands different from each other.

Solution to Problem

According to an aspect of the present invention to achieve the object described above, there is provided a spintronic wireless communication system for simultaneously modulating multi-band frequency and amplitude, including: a plurality of spin-torque transfer devices which have frequency characteristics different from each other, perform spin OOK modulation or multi-level ASK modulation on input data, and output multi-band OOK modulation signals or multi-band multi-level ASK modulation signals; a plurality of matching networks which match individual impedances of the plurality of spin-torque transfer devices; and an antenna which receives the multi-band OOK modulation signals or the multi-band multi-level ASK modulation signals from one end of the plurality of matching networks, and transmits the signals to the outside.

According to another aspect of the present invention to achieve the object described above, there is provided a method for manufacturing a spintronic wireless communication system for simultaneously modulating multi-band frequency and amplitude, including the steps of: disposing a plurality of spin-torque transfer devices to be separated at predetermined distances; disposing point magnets to be adjacent to the plurality of spin-torque transfer device, respectively, and measuring a frequency signal of each spin-torque transfer device; adjusting a frequency by adding or subtracting the positions or numbers of point magnets to adjust a frequency of an output signal of the spin-torque transfer device to a target frequency; and connecting a plurality of matching networks for matching impedances of an antenna and the plurality of spin-torque transfer devices between one end of the plurality of spin-torque transfer devices and one end of a wideband antenna.

Advantageous Effects of Invention

There is an effect in that the intensity of the current applied to the spin-torque transfer devices or the size or the distance of the point magnets disposed on the neighborhood thereof can be adjusted without using the complicated and bulky modulator, so that it can generate various frequency signals, thereby remarkably decreasing the area of the transmitter and the power consumption.

In the present invention, the frequency bandwidths are separated at a predetermined interval per each spin-torque transfer device to operate the plurality of the spin-torque transfer devices at the same time in the array structure of the spin-torque transfer devices owing to the wideband operating characteristics, so that the OOK-modulated signals or the multi-level ASK modulated signals can be generated every one sub clock period, thereby remarkably increasing the transmission speed of the data.

In the present invention, since it can implement the transmitter by using the spin-torque transfer devices, the miniaturization and integration thereof are easy.

A voltage controlled oscillator (VCO) used as the conventional oscillator is enabled by applying power, and has a long oscillation-settling time until a required frequency is obtained, and only a communication transmission speed by a unit of kbps can be embodied. However, in the present invention, a frequency signal is obtained using a spin-torque transfer device with a very short oscillation-settling time, and a spin OOK modulation method is applied, thereby transmitting several tens megabits theoretically.

A direct-conversion wireless communication device made on the basis of the existing electronic circuit has a problem that it is difficult to obtain each frequency signal in a wide band due to a narrowband operation of about 10% of the VCO. However, the present invention solves such a problem, spin-torque devices can easily obtain many frequencies in a spin-array structure using frequency oscillation operation characteristics of 100% or more of the spin-torque transfer device, and user convenience is improved for a user to control a frequency for the purpose.

BRIEF DESCRIPTION OF DRAWINGS

The above and other objects, features and advantages of the present invention will be more apparent from the following detailed description taken in conjunction with the accompanying drawings, in which.

DESCRIPTION OF EMBODIMENTS

Hereinafter, specific embodiments according to the present invention will be described with reference to the drawings. The exemplified drawings enlarge and illustrate only essential contents for clarity of the present invention, and omit collateral contents, and thus the present invention should not be interpreted to be limited to the drawings.

In the present invention, a frequency is different with each spin-torque transfer device using characteristics that the spin-torque transfer device has a frequency varied in proportional to an intensity of current or magnetic field, wideband frequency characteristics can be embodied through a plurality of spin-torque transfer devices, point magnets are disposed around the spin-torque transfer devices to adjust frequencies using a point that the spin-torque transfer device is affected by magnetic field to embody different frequency characteristics, and thus a user can easily control the frequencies of the spin-torque transfer devices.

In addition, according to the present invention, a plurality of bits can be applied to one spin-torque transfer device. In other words, an intensity of current is adjusted to output a plurality of frequency signals with different amplitude to one spin-torque transfer device, and thus data transmission efficiency is increased.

Figure 1:
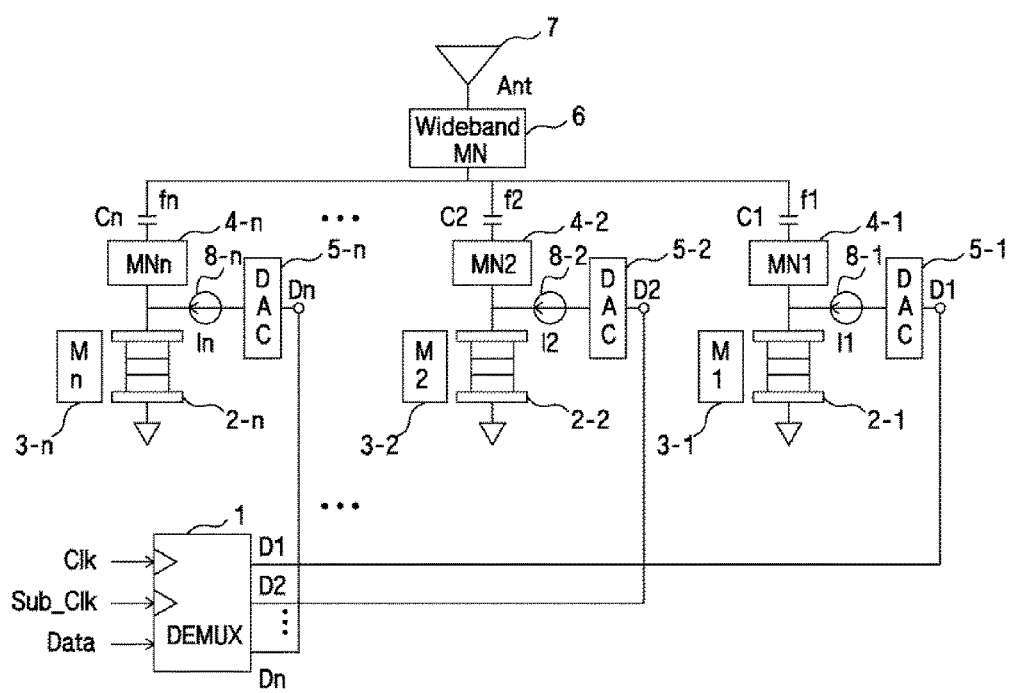
FIG. 1 illustrates a spintronic wireless communication system for simultaneously modulating multi-band frequency and amplitude according to the present invention.

FIG. 1 illustrates a spintronic wireless communication system for simultaneously modulating multi-band frequency and amplitude according to the present invention.

The spintronic wireless communication system for simultaneously modulating multi-band frequency and amplitude illustrated in FIG. 1 includes a demultiplexer 1, a first spin-torque transfer device 2-1 to an n-th spin-torque transfer device 2-n, a first digital-to-analog converter 5-1 to an n-th digital-to-analog converter 5-n, a first power supply unit 8-1 to an n-th power supply unit 8-n, a first matching network 4-1 to an n-th matching network 4-n, a first point magnet 3-1 to an n-th point magnet 3-n, a wideband matching network 6, and an antenna 7. In this case, n is a natural number of 1 more.

The demultiplexer 1 sequentially outputs data input in synchronization with a clock Clk and a sub-clock Sub_clk to n output channels. The demultiplexer 1 may be embodied by a circuit which divides data input continuously in series, to be parallel, and outputs them.

The clock Clk has, as a period, a value obtained by multiplying the sub-clock Sub_clk defined as an ideal time in which the spin-torque transfer device has an oscillation-settling time, that is, a settling oscillation time, by the number of spin-torque transfer devices (n, n>1).

Figure 3:
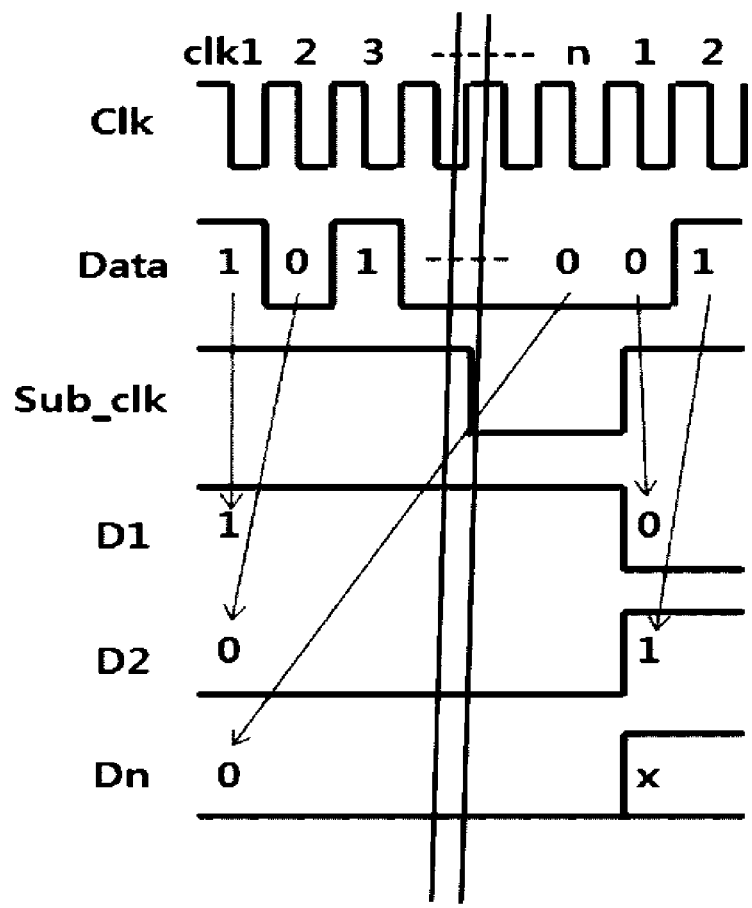
FIG. 3 is a time diagram illustrating a method of assigning data to spin-torque transfer devices in output channels when the data is sequentially input to a demultiplexer according to the present invention.
Figure 4:
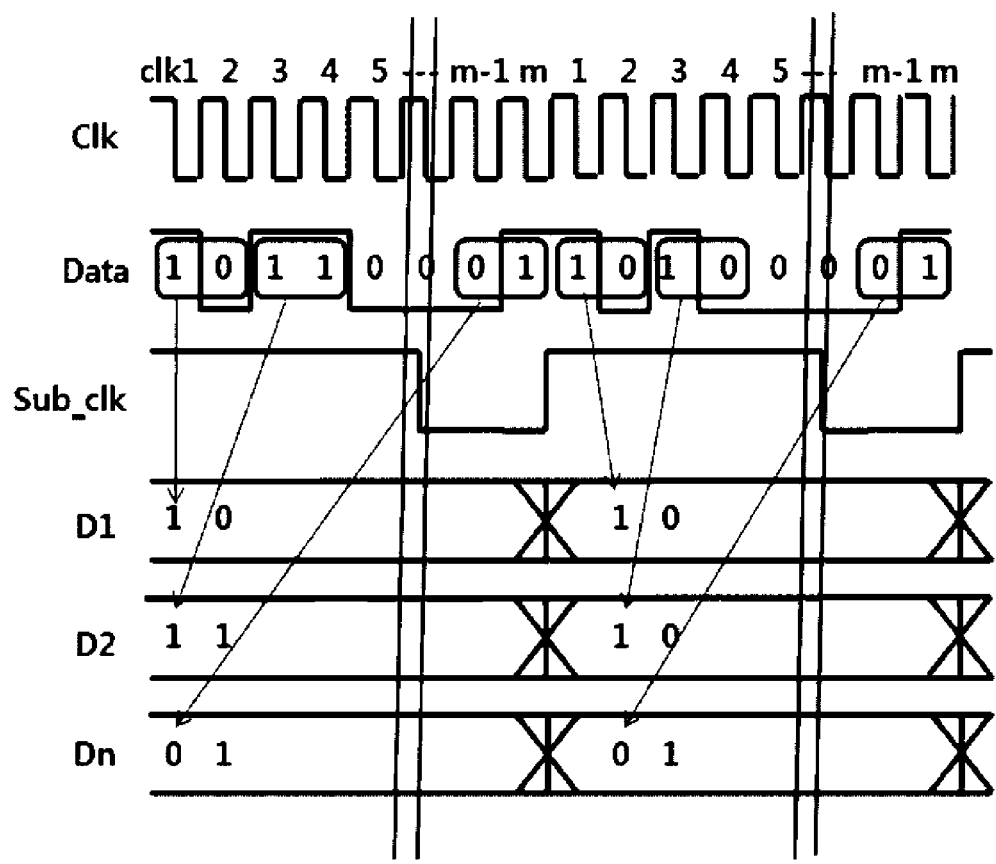
FIG. 4 is a time diagram illustrating a method of assigning multi-bit data to spin-torque transfer devices in output channels when the data is sequentially input to a demultiplexer according to the present invention.

Referring to FIG. 3 and FIG. 4, a period of the sub-clock Sub_clk is related to the oscillation-settling time of the spin-torque transfer device, a value of the sub-clock Sub_clk has a value larger than the settling time, for stable data transmission through the spin-torque transfer device. The spin-torque transfer device has an advantage of a very short oscillation-settling time as compared with an oscillator such as the conventional voltage controlled oscillator (VCO). According to the present invention, in order to obtain a maximum transmission rate by maximizing this effect, a period of inputting data to each spin-torque transfer device is adjusted to a period more than the settling time on the basis of the oscillation-settling time of the spin-torque transfer device. In other words, in the present invention, the fastest period of the sub-clock Sub_clk is to use a period corresponding to the oscillation-settling time. The clock Clk coinciding with the period of continuously input data uses a value obtained by multiplying the period of sub-clock Sub-_clk related to the oscillation-settling time by the number of spin-torque transfer devices embodied in parallel or array, thereby maximizing performance of the spin-torque transfer devices. Therefore, according to the present invention, it is possible to improve a transmission speed.

In other words, according to the present invention, the transmission speed is significantly increased in proportion to the number of spin-torque transfer devices as compared with the conventional modulator, and it is possible to embody a transmitter having modulation characteristics with a very high transmission speed considering fast transmission characteristics of the spin-torque transfer devices.

The first spin-torque transfer device 2-1 to the n-th spin-torque transfer device 2-$n$ adjust an intensity of applied current and a position of an adjacent point magnet or a size of the spin-torque transfer device to have frequency characteristics different from each other. The first spin-torque transfer device 2-1 to the n-th spin-torque transfer device 2-$n$ perform OOK modulation or multi-level ASK modulation on the input data, and output multi-band OOK modulation signals or multi-band multi-level ASK modulation signals.

Figure 6:
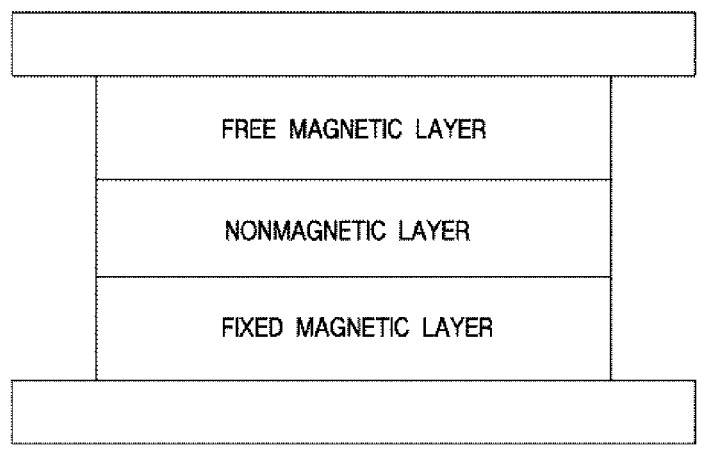
FIG. 6 is a sectional view of a spin-torque transfer device according to the present invention.

The spin-torque transfer device is generally formed of a multi-layer thin film structure of a fixed magnetic layer, a nonmagnetic layer, and a free magnetic layer as illustrated in FIG. 6, but is not limited thereto. By applying spin current to the spin-torque transfer device, spin of conduction electrons is spin-polarized while the current flows to pass through the structure of the nonmagnetic layer and the magnetic layer. In this case, since a spin angle movement amount has to be reserved always, force corresponding to the change in spin angle movement amount of the conduction electrons is transferred to magnetization of the magnetic layer, and torque acts which changes a magnetization direction of the magnetic layer to a direction opposite to the change of a spin polarization direction of the conduction electrons.

When magnetic field with a proper size or spin transfer torque is applied to the spin-torque transfer device in a direction to move magnetization in directions opposite to each other simultaneously, the magnetization is not directed to a direction induced by the magnetic field or a direction induced by the spin transfer torque, and continues to rotate at a predetermined frequency. In this case, the rotation frequency of the magnetization is varied according to the change in intensity of applied magnetic field or current, and can be adjusted in a wide frequency range in a band of several GHz to several tens GHz. Since magnetic resistance is continuously changed the magnetization of a free layer rotates with respect to a fixed layer having a predetermined magnetization direction, it is possible to obtain an alternating current output signal from a direct current input signal, and thus it can be used as an oscillator.

The spin-torque transfer device can be embodied by a nano-contact or nano-pillar structure using a nano-process technology. The nano-contact is a structure in which a fixed magnetic layer, a nonmagnetic layer, and a free magnetic layer are laminated, and a contact window is made at an upper portion to form an electrode, and the nano-pillar is a structure in which a fixed magnetic layer, a nonmagnetic layer, and a free magnetic layer are laminated, and then an device outside is etched to form a pillar shape.

The free magnetic layer is a soft magnetic material, a magnetization direction of which is changed by magnetic field or current applied from the outside of a layer. The nonmagnetic layer is nonmagnetic metal or an insulating material. When the nonmagnetic layer is formed of the insulating material, a thickness thereof has to be thin to the extent that a tunneling phenomenon can occur. The fixed magnetic layer is a ferromagnetic material, a magnetization direction of which is not changed by ambient magnetic field or current. When the nonmagnetic layer is formed of an insulating layer, it becomes a tunneling magneto-resistance (TMR) device, and when the nonmagnetic layer is a conductive layer, it becomes a giant magneto-resistance (GMR) device. The free magnetic layer may be a layer including a magnetic vortex.

The spin-torque transfer device has various oscillation frequency characteristics according to applied current. There is a spin-torque transfer device, an oscillation frequency is increased when applied current is increased according to materials of a used magnetic layer and, on the contrary, there is a spin-torque transfer device, an oscillation frequency is decreased when applied current is increased. Alternatively, there is a case where, in one spin-torque transfer device, an oscillation frequency is decreased and then increased according to the increase of current. Since factors affecting the oscillation frequency of the spin-torque transfer device are factors determined according to materials such as a saturation freedom degree, an attenuation constant, and a spin polarization factor, and shape factors such as a volume of a free magnetic layer, it is possible to manufacture oscillators with different oscillation frequencies when adjusting a volume (area or thickness) of the free magnetic layer.

In addition, by adjusting the intensity of current or magnetic field applied to the spin-torque transfer device, it is possible to control the oscillation frequency. In the course of manufacturing the spin-torque transfer device, magnetic field is controlled using a method of controlling stray magnetic field and a method of disposing a point magnet to be adjacent to the spin-torque transfer device, thereby manufacturing oscillators with different oscillation frequencies. Alternatively, a spin-torque transfer device which oscillates different frequencies even in the same magnetic field environment is embodied using a nano-process, to make various oscillation frequencies in one magnetic field or nonmagnetic field environment.

The first matching network 4-1 to the n-th matching network 4-$n$ match individual impedances of the first spin-torque transfer device 2-1 to the n-th spin-torque transfer device 2-$n$. The matching networks may be embodied with lumped devices or transmission lines. Since impedance components are different among spin-torque transfer devices, the impedances have to be individually matched. The first matching network 4-1 to the n-th matching network 4-$n$ are narrowband matching networks which filter frequency components output from the other spin-torque transfer devices other than each spin-torque transfer device.

The wideband matching network 6 is connected between one end of the first matching network 4-1 to the n-th matching network 4-$n$ and one end of the antenna 7, and matches impedances in the entire frequency bands output from the spin-torque transfer devices.

If sufficient impedance matching is not performed in the entire frequency bands, there is a problem that a transmission loss becomes large. Accordingly, impedance matching is performed in each frequency band, the wideband matching network 6 matches impedances in the entire frequency bands of the spin-torque transfer devices wider than those of the first matching network 4-1 to the n-th matching network 4-n, only the minimum transmission loss is permitted, distortion of signals is decreased, and it is possible to reduce the transmission loss.

The antenna 7, one end of which is connected to one end of the wideband matching network 6, receives the multi-band OOK modulation signals or the multi-band multi-level ASK modulation signals and simultaneously transmits the modulation signals to the outside. The antenna 7 is preferably an antenna having a matching function in a wide band, and an antenna having a matching function in the entire frequency bands output from the spin-torque transfer devices.

The first point magnet 3-1 to the n-th point magnet 3-n are disposed to be separated at predetermined distance from the spin-torque transfer devices according to target frequencies of the spin-torque transfer devices, and each point magnet varies frequency characteristics of the adjacent spin-torque transfer device. The frequencies of the output signals of the spin-torque transfer devices are adjusted by changing the sizes or the number of point magnets.

Figure 2:
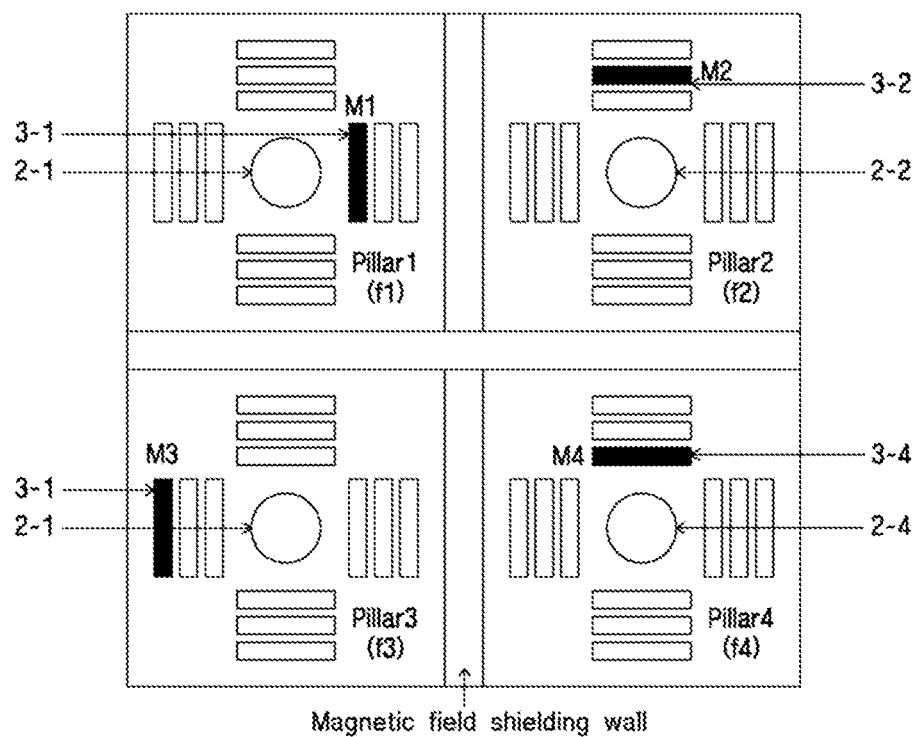
FIG. 2 is a sectional view illustrating a location of point magnets for a frequency adjusting of spin-torque transfer devices in a spintronic wireless communication system for simultaneously modulating multi-band frequency and amplitude according to the present invention.

In addition, referring to FIG. 2, a magnetic shielding wall, a magnetic shielding sheet, or a magnetic shielding line may be further provided between the spin-torque transfer device and the adjacent spin-torque transfer device, to reduce magnetic field interference between the spin-torque transfer devices.

In addition, a distance between the spin-torque transfer device and the adjacent spin-torque transfer device is ten times the size of the spin-torque transfer device, and thus it is possible to block magnetic field interference between the spin-torque transfer devices.

A method for manufacturing a spintronic wireless communication system for simultaneously modulating multi-band frequency and amplitude according to another embodiment of the present invention will be described as follows.

Referring to FIG. 2 as an example, a plurality of spin-torque transfer devices are disposed to be separated at predetermined distances.

Point magnets are disposed adjacent to the plurality of spin-torque transfer devices, respectively, and a distance to the spin-torque transfer device or a size or the number of point magnets is adjusted to output frequency signals different among the spin-torque transfer devices. The point magnets are disposed adjacent to the plurality of spin-torque transfer devices, respectively, and frequency signals of the spin-torque transfer devices are measured. In order to adjust the frequency of the output signal of the spin-torque transfer device to a target frequency, the position or the number of point magnets is added or subtracted, thereby reaching a desired frequency. In addition, in manufacturing a spin-torque transfer device array, in order for a user to easily adjust an oscillation frequency, as illustrated in FIG. 2, positions to dispose the point magnets may be displayed, and frequencies generated when the point magnets are positioned at the positions may be displayed.

A plurality of matching networks which match impedances of the plurality of spin-torque transfer devices and the wideband antenna are connected between one end of the plurality of spin-torque transfer devices and one end of the wideband antenna. A plurality of output channels of the demultiplexer 1 are connected to the plurality of spin-torque transfer devices corresponding to the order of the output channels.

An output terminal of a clock generating unit which generates a clock Clk having, as a period, a value obtained by multiplying a sub-clock Sub_clk considering an oscillation-settling time of the spin-torque transfer device by the number of spin-torque transfer devices, is connected to a clock input terminal of the demultiplexer 1.

Hereinafter, an operation of a spintronic wireless communication system for simultaneously modulating multi-band frequency and amplitude according to the present invention will be described as follows.

Referring to FIG. 3, whenever a clock Clk is synchronized, data are input to the demultiplexer 1 through one channel sequentially from D1. The output of the demultiplexer 1 is outputted to n channels, the input data D1 is output to the first channel at the first clock Clk, the input data D2 is output to the second channel at the second clock Clk, and the input data Dn is output to the n-th channel at the n-th clock Clk. Using a sub-clock Sub_clk having one clock from 1 to n, channel data are simultaneously transmitted to the first spin-torque transfer device 2-1 to the n-th spin-torque transfer device 2-n for each period of the sub-clock Sub_clk. In addition, the input data Dn+1 is output to the first channel at the (n+1)-th clock Clk. The channels are connected to n spin-torque transfer devices, respectively. Each spin-torque may include a power supply unit, and each of the power supply units 8-1 to 8-n supplies or blocks current or voltage to the spin-torque transfer device according to whether the data transmitted from each channel is high or low. Accordingly, all the spin-torque transfer devices are operated according to the input data levels, perform OOK modulation having a unique frequency of each spin-torque transfer device, and output OOK modulation signals. Current intensities applied by the power supply units are allowed to be different from each other or magnetic field conditions are designed differently, and thus the spin-torque transfer devices can have frequencies different from each other. Alternatively, by adjusting variables such as a shape and a size of the spin-torque transfer device having an influence on the spin oscillation frequency using a nano-process, the spin-torque transfer devices can have frequencies different from each other even in the same magnetic field environment. Accordingly, the frequencies of the OOK modulation signals of the spin-torque transfer devices are different from each other.

The plurality of OOK modulation signals are transmitted through one antenna. Accordingly, in order to solve the problem that the modulation signals cannot have the maximum transmission efficiency, impedances are matched through the matching networks for each spin-torque transfer device, the wideband matching network is used even at the antenna terminal, the impedances are matched in the entire frequency bands of the spin-torque transfer devices, and it is possible to minimize a transmission loss.

The transmission speed of the total data may be increased in proportion to the number of spin-torque transfer devices. For example, when the number of spin-torque transfer devices is 10 or more, the transmission speed is several hundred Mbps, and when the number of spin-torque transfer devices is 100 or more, the transmission speed can be raised to several Gbps.

In addition, according to the present invention, in order to further improve frequency use efficiency, a digital-to-analog converter may be added, and a multi-level ASK modulation operation may be added. The multi-level ASK modulation is to transmit multi-bit information with one frequency signal. In such a manner, according to the present invention, a frequency is assigned to each spin-torque transfer device to perform amplitude modulation. Accordingly, it is a new spin modulation method of maximizing the transmission speed simultaneously using the frequency and amplitude different from the existing, in modulation.

Referring to FIG. 4, multi-bit is assigned for each output channel of the demultiplexer 1 at once, and the multi-bit is input to the power supply unit of each spin-torque transfer device. For example, referring to FIG. 3 in order to embody a spin-torque transfer device having a 4-level ASK modulation function, data of 1 and 0 are assigned to the first output channel of the demultiplexer 1, data of 1 and 1 are assigned to the second output channel of the demultiplexer 1, and data of 0 and 1 are assigned to the n-th output channel of the demultiplexer 1.

The first output channel of the demultiplexer 1 is input to the power supply unit of the first spin-torque transfer device 2-1. Each power supply unit includes a digital-to-analog converter, and outputs analog signals with various amplitudes to the spin-torque transfer device according to the multi-bit information. The analog signal may be directly current or voltage. When current with an intensity proportional to the amplitude of the analog signal or multi-bit information is generated through current mirrors provided in the power supply units 8-1 to 8-n, it is possible to make a plurality of current levels, and the plurality of current levels allow the spin-torque transfer device to directly output various frequency signals or various amplitude signals. Referring to FIG. 4, a 4-level ASK modulation signal is output to each spin-torque transfer device by 2-bit input data. Therefore, according to the present invention, it is possible to increase a transmission speed 2 n times by n spin-torque transfer devices.

The frequency of the sub-block Sub_clk is related to a transmission speed of generation and transmission with a clock signal equal to or more than a settling time of each spin-torque transfer device. The frequency of the clock Clk of the demultiplexer 1 is a value obtained by multiplying the frequency of the sub-clock Sub_clk by the number of spin-torque transfer devices, that is, n. Accordingly, the final transmission speed is increased as much as a multi-level modulation exponent and the total number of spin-torque transfer devices.

In addition, referring to FIG. 2, at the time of manufacturing a plurality of spin-torque transfer devices constituting a transmitter, that is, a spin-torque transfer device array, it is possible to obtain a desired frequency band by controlling a distance and a size of a point magnet for each spin-torque transfer device. However, magnetic field interference may occur in a near spin-torque transfer device by the point magnet. According to the present invention, in order to solve such a problem, a distance between the spin-torque transfer devices is secured 10 times or more a length including the point magnet and the spin-torque transfer device, or a magnetic shielding wall, a magnetic shielding sheet, or a magnetic shielding line is disposed between the spin-torque transfer devices, thereby blocking or reducing the magnetic field interference between the spin-torque transfer devices.

Figure 5:
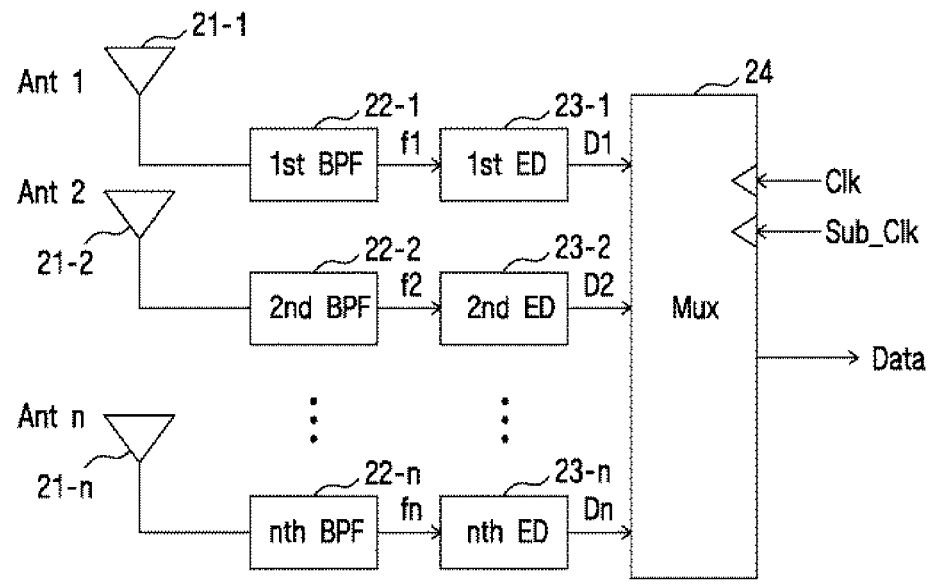
FIG. 5 is a block diagram illustrating a reception unit of the spintronic wireless communication system for simultaneously modulating multi-band frequency and amplitude according to the present invention.

A reception unit of the spintronic wireless communication system for simultaneously modulating multi-band frequency and amplitude illustrated in FIG. 5 according to the present invention includes a first narrowband antenna 21-1 to an n-th narrowband antenna 21-n, a first band-pass filter 22-1 to an n-th band-pass filter 22-n, a first envelope detector 23-1 to an n-th envelope detector 23-n, and a multiplexer 24.

The first narrowband antenna 21-1 to the n-th narrowband antenna 21-n receive multi-band OOK modulation signals or multi-band multi-level ASK modulation signals.

The first band-pass filter 22-1 to the n-th band-pass filter 22-n filter the plurality of OOK modulation signals or the plurality of multi-level ASK modulation signals received by the plurality of antennas, and outputs the modulation signals to the plurality of envelope detectors.

The first envelope detector 23-1 to the n-th envelope detector 23-n detect envelopes from the signals passing through the first band-pass filter 22-1 to the n-th band-pass filter 22-n, and demodulate data D1, D2, . . . , Dn. In addition, the first envelope detector 23-1 to the n-th envelope detector 23-n demodulate data using oscillation signals generated by the spin-torque transfer devices. The multiplexer 24 receives the plurality of data (D1, D2, . . . , Dn) in parallel, sequentially mixes the data in synchronization with the clock Clk and the sub-clock Sub_clk, and outputs serial data.

In other words, when receiving the multi-band OOK modulation signals or the multi-band multi-level ASK modulation signals modulated in the multi-band spintronic transmitter through the first narrowband antenna to the n-th narrowband antenna, the envelopes are detected through the first envelope detector 23-1 to the n-th envelope detector 23-n, and data is demodulated. The demodulated data (D1 to Dn) are sequentially mixed in synchronization with the clock Clk and the sub-clock Sub_clk through the multiplexer 24, and are restored to total data. The multiplexer 24 restores n data for each one period of the sub-clock Sub_clk.

Figure 7:
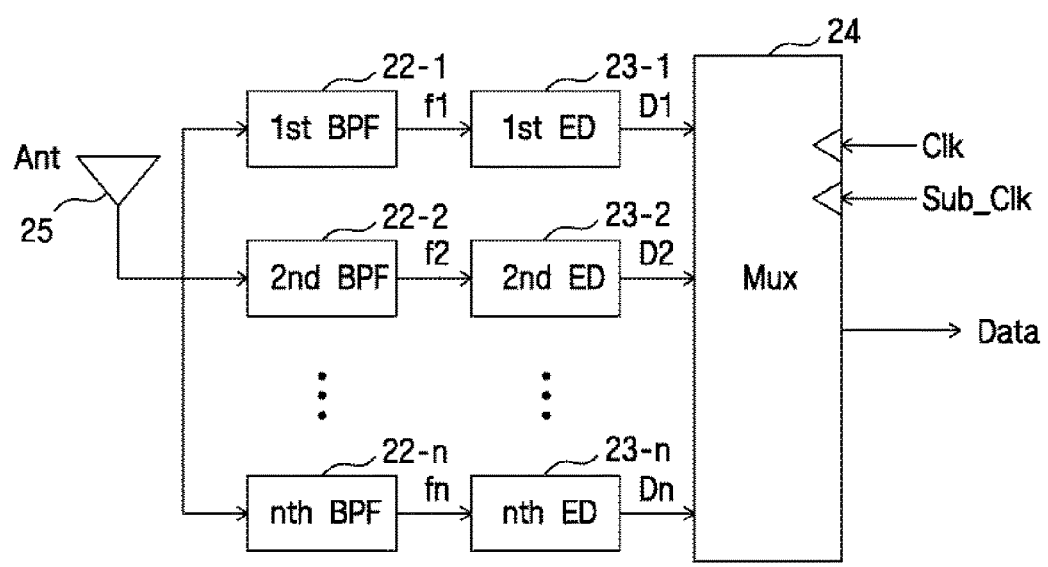
FIG. 7 is a block diagram illustrating a reception unit of the spintronic wireless communication system for simultaneously modulating multi-band frequency and amplitude according to another embodiment of the present invention.

FIG. 7 illustrates a reception unit of a spintronic wireless communication system for simultaneously modulating multi-band frequency and amplitude according to another embodiment of the present invention, and the reception unit includes a first band-pass filter 22-1 to an n-th band-pass filter 22-n, a first envelope detector 23-1 to an n-th envelope detector 23-n, and a multiplexer 24.

The reception unit of the spintronic wireless communication system for simultaneously modulating multi-band frequency and amplitude receives multi-band OOK modulation signals or multi-band multi-level ASK modulation signals by not a plurality of narrowband antennas but one wideband antenna 25, each of the band-pass filters 22-1 to 22-n based on frequencies filters only a signal of the corresponding frequency band, and data are demodulated through the envelope detectors 23-1 to 23-n. The demodulated data D1 to Dn are sequentially mixed in the multiplexer 24 in synchronization with the clock Clk and the sub-clock Sub_clk, and are restored to total data.

INDUSTRIAL APPLICABILITY

The present invention can be used in the field of wireless communication transmitter and receiver for transmitting and receiving high-speed and high-capacity data.

What is claimed is:
1. A spintronic wireless communication system for simultaneously modulating multi-band frequency and amplitude, comprising:
a plurality of spin-torque transfer devices which have frequency characteristics different from each other, perform spin OOK modulation or multi-level ASK modulation on input data, and output multi-band OOK modulation signals or multi-band multi-level ASK modulation signals;

a plurality of matching networks which match individual impedances of the plurality of spin-torque transfer devices; and an antenna which receives the multi-band OOK modulation signals or the multi-band multi-level ASK modulation signals from one end of the plurality of matching networks, and transmits the signals to the outside.

2. The spintronic wireless communication system for simultaneously modulating multi-band frequency and amplitude according to claim 1, further comprising a demultiplexer which sequentially assigns digital data continuously input in synchronization with a clock to the plurality of spin-torque transfer devices.

3. The spintronic wireless communication system for simultaneously modulating multi-band frequency and amplitude according to claim 2,
wherein the demultiplexer is synchronized with the clock and a sub-clock,
wherein the clock has, as a period, a value obtained by dividing a period of the sub-clock of the spin-torque transfer device by the number of spin-torque transfer devices, and
wherein a minimum period of the sub-clock is an oscillation-settling time of the spin-torque transfer device.

4. The spintronic wireless communication system for simultaneously modulating multi-band frequency and amplitude according to claim 1, further comprising a wideband matching network which is connected between one end of the plurality of matching networks and one end of the antenna, to reduce a transmission loss of the modulation signals output from the spin-torque transfer devices.

5. The spintronic wireless communication system for simultaneously modulating multi-band frequency and amplitude according to claim 1, wherein the plurality of spin-torque transfer devices are manufactured to perform an oscillation operation with frequency characteristics set differently from each other even in the same magnetic field environment or nonmagnetic field environment.

6. The spintronic wireless communication system for simultaneously modulating multi-band frequency and amplitude according to claim 5, further comprising a magnetic shielding wall, a magnetic shielding sheet, or a magnetic shielding line which is disposed between the spin-torque transfer devices, to block magnetic field interference between the spin-torque transfer devices.

7. The spintronic wireless communication system for simultaneously modulating multi-band frequency and amplitude according to claim 1, wherein the antenna is a wideband matching antenna which reduces a transmission loss of the multi-band modulation signals.

8. The spintronic wireless communication system for simultaneously modulating multi-band frequency and amplitude according to claim 1, further comprising a digital-to-analog converter which outputs an analog signal with amplitude varied according to the input data, wherein the analog signal with the varied amplitude is applied to the spin-torque transfer device to vary amplitude or frequency characteristics of a signal output from the spin-torque transfer device, and the multi-level ASK modulation signal is output.

9. The spintronic wireless communication system for simultaneously modulating multi-band frequency and amplitude according to claim 8, further comprising a power supply unit which applies current with intensity proportional to the amplitude of the analog signal to the spin-torque transfer device according to the output of the analog converter.

10. A method for manufacturing a spintronic wireless communication system for simultaneously modulating multi-band frequency and amplitude, comprising the steps of:
disposing a plurality of spin-torque transfer devices to be separated at predetermined distances;
disposing point magnets to be adjacent to the plurality of spin-torque transfer device, respectively, and measuring a frequency signal of each spin-torque transfer device;
adjusting a frequency by adding or subtracting the positions or numbers of point magnets to adjust a frequency of an output signal of the spin-torque transfer device to a target frequency; and
connecting a plurality of matching networks for matching impedances of an antenna and the plurality of spin-torque transfer devices between one end of the plurality of spin-torque transfer devices and one end of a wideband antenna.

11. The method for manufacturing a spintronic wireless communication system for simultaneously modulating multi-band frequency and amplitude according to claim 10, further comprising the steps of connecting a plurality of channels of a demultiplexer, which sequentially outputs data input continuously in synchronization with a clock to the plurality of the channels, to current input signals of the plurality of spin-torque transfer devices.

12. The method for manufacturing a spintronic wireless communication system for simultaneously modulating multi-band frequency and amplitude according to claim 10, further comprising the steps of connecting an output terminal of a clock generating unit, which generates a clock having as a period a value obtained by dividing an oscillation-settling time of the spin-torque transfer device by the number of spin-torque transfer devices, to a clock input terminal of the demultiplexer.

13. The method for manufacturing a spintronic wireless communication system for simultaneously modulating multi-band frequency and amplitude according to claim 10, further comprising the steps of displaying a location of the point magnets based on each frequency on the spintronic wireless communication system and providing information of frequencies generated when the point magnets are positioned at the corresponding positions in order for a user to adjust an oscillation frequency.

14. A spintronic wireless communication system of simultaneously modulating multi-band frequency and amplitude in a multi-band wireless communication system, comprising:
a plurality of narrowband antennas which receive multi-band OOK modulation signals or multi-band multi-level ASK modulation signals;
a plurality of envelope detectors which detect envelopes from the modulation signals individually received by the plurality of narrowband antennas and demodulate data; and
a multiplexer which sequentially mixes the demodulated data to one output channel according to a clock and a sub-clock having a predetermined multiple of the clock as a period.

15. The spintronic wireless communication system of simultaneously modulating multi-band frequency and amplitude in a multi-band wireless communication system according to claim 14, further comprising a plurality of band-pass filters for passing predetermined frequency bands of the plurality of OOK modulation signals or the plurality of multi-level ASK modulation signals and outputting them to the plurality of envelope detectors.

* * * * *